(12) United States Patent
Wolbank (10) Patent No.: US 9,529,032 B2
(45) Date of Patent: Dec. 27, 2016

(54) METHOD AND DEVICE FOR DETECTING A DETERIORATION IN THE STATE OF AN INSULATION IN AN OPERATING ELECTRIC MACHINE

(75) Inventor: Thomas Wolbank, Vienna (AT)

(73) Assignee: TECHNISCHE UNIVERSITAT WIEN, Vienna (AT)

( * ) Notice: Subject to any disclaimer, the term of this patent is extended or adjusted under 35 U.S.C. 154(b) by 70 days.

(21) Appl. No.: 14/236,591

(22) PCT Filed: Aug. 1, 2012

(86) PCT No.: PCT/AT2012/000201
§ 371 (c)(1),
(2), (4) Date: Jan. 31, 2014

(87) PCT Pub. No.: WO2013/016750
PCT Pub. Date: Feb. 7, 2013

(65) Prior Publication Data
US 2014/0176152 A1 Jun. 26, 2014

(30) Foreign Application Priority Data

Aug. 1, 2011 (AT) ................................ A 1120/2011

(51) Int. Cl.
*G01R 31/02* (2006.01)
*G01R 31/34* (2006.01)
(Continued)

(52) U.S. Cl.
CPC ......... *G01R 31/025* (2013.01); *G01R 31/1227* (2013.01); *G01R 31/343* (2013.01); *G01R 31/06* (2013.01)

(58) Field of Classification Search
CPC ........ G01R 31/025; G01R 27/08; G01R 31/34
(Continued)

(56) References Cited

U.S. PATENT DOCUMENTS 6,466,034 B1 10/2002 Wang et al. .................. 324/547
6,483,319 B1 * 11/2002 Kendig ................ G01R 31/343
324/551
(Continued)

FOREIGN PATENT DOCUMENTS

EP 2 405 570 1/2012
JP 57-008464 1/1982
(Continued)

OTHER PUBLICATIONS

Grubic et al., "A New Concept for Online Surge Testing for the Detection of Winding Insulation Deterioration", *Energy Conversion Congress and Exposition* (ECCE), pp. 2747-2754, 2010.
(Continued)

*Primary Examiner* — Jermele M Hollington
*Assistant Examiner* — Zannatul Ferdous
(74) *Attorney, Agent, or Firm* — Norton Rose Fulbright US LLP (57) ABSTRACT

The invention relates to a method and a device (1) for the online-detection of a deterioration in the state of an insulation in an electric machine (2). A stepped voltage is applied to the winding(s) (3) of the machine (2) with the aid of a converter (41), and the current (i) induced in this manner, and/or the time derivative (di/dt) thereof, is acquired as a measurement signal with the aid of at least one sensor (6, 7, 8) and is then oversampled with a frequency higher than the frequencies characteristic for settling. The signal obtained by said oversampling is then evaluated with regard to parameters of the settling process such as overshooting (Ah) and/or natural frequency (1/$\Delta$T) and/or a damping constant, in order to detect any deterioration in the insulation.

17 Claims, 7 Drawing Sheets

(51) Int. Cl.
*G01R 31/12* (2006.01)
*G01R 31/06* (2006.01)

(58) Field of Classification Search
USPC .......................................................... 324/510
See application file for complete search history.

(56) References Cited

U.S. PATENT DOCUMENTS

| | | | | |
|---|---|---|---|---|
| 2005/0190094 | A1* | 9/2005 | Andersen | H02P 7/29 341/157 |
| 2009/0284204 | A1* | 11/2009 | Colby | H02P 21/145 318/490 |
| 2009/0284212 | A1* | 11/2009 | Turner | H02P 23/14 318/767 |
| 2010/0169030 | A1* | 7/2010 | Parlos | G01H 1/00 702/58 |
| 2011/0210750 | A1* | 9/2011 | Medelius | H01B 1/22 324/543 |
| 2012/0038304 | A1* | 2/2012 | Yeh | B60L 3/0061 318/490 |

FOREIGN PATENT DOCUMENTS

| | | |
|---|---|---|
| JP | 57-153271 | 9/1982 |
| JP | 2005-037351 | 2/2005 |
| JP | 2010-268645 | 11/2010 |
| RU | 2208236 C2 | 7/2003 |
| WO | WO 03/087855 | 10/2003 |
| WO | WO 2005/062456 | 7/2005 |

OTHER PUBLICATIONS

Grubic et al., "A survey on Testing and Monitoring Methods for Stator Insulation Systems of Low-Voltage Induction Machines Focusing on Turn Insulation Problems", *IEEE Transactions on Industrial Electronics*, 55(12):4127-4136, 2008.

Grubic et al., "Investigation on surge testing for winding insulation fault detection in an online environment", *Energy Conversion Congress and Exposition*, IEEE, pp. 3255-3261, 2009.

International Preliminary Report on Patentability issued in PCT Application No. PCT/AT2012/000201, mailed Feb. 13, 2014.

International Search Report issued in PCT Application No. PCT/AT2012/000201, mailed Nov. 26, 2012.

Nussbaumer and Wolbank, "Saliency Tracking Based Sensorless Control of AC Machines Exploiting Inverter Switching Transients", Proceedings of IEEE Symposium on Sensorless control for Electrical Drives, *SLED*, pp. 237-242, 2010.

Office Communication issued in Austrian Patent Application No. 3B A 1120/2011-1, dated Jun. 12, 2012.

* cited by examiner

METHOD AND DEVICE FOR DETECTING A DETERIORATION IN THE STATE OF AN INSULATION IN AN OPERATING ELECTRIC MACHINE

This application is a national phase application under 35 U.S.C. §371 of International Application No. PCT/AT2012/000201 filed 1 Aug. 2012, which claims priority to Austrian Application No. A 1120/2011 filed 1 Aug. 2011. The entire contents of each of the above-referenced disclosures is specifically incorporated herein by reference without disclaimer.

The invention concerns a method and a device for the online detection of a deterioration in the state of insulation in or at an electric machine.

Inverter-controlled electric machines are increasingly being used in a very broad range of areas. In particular, such drive systems are not only being used as standard in industry, but also in traction systems, and in particular in safety-critical systems. In this regard, it is becoming ever more important to preventatively monitor these systems with respect to their condition and to maintain them. A major reason for the repeated failure of such machines is in the deterioration of insulations, in particular on the stator windings. Studies have shown that approximately 30 to 40% of all failures are stator-related, of which about 70% in turn are due to deterioration or faults in the winding insulation and in the insulation to ground.

The insulation of the stator windings is subject to particularly high stresses when operated with an inverter. Of significance in this regard are thermal, electrical, mechanical and environmental stresses. Over time these stresses result in a deterioration of the insulation and can lead to a serious failure of the machine itself or of the entire drive system with the machine.

Deterioration of insulation states can occur not only within windings however, but also at supply conductors or electrical wiring. Here also, deteriorations or faults in insulation are causes of a machine failure, and therefore changes in the state of insulation here should also be detected as quickly as possible.

In the prior art, various online and offline methods for detecting insulation faults have already been proposed, a survey and assessment of the various techniques being disclosed, for example, in the article Grubic S. et al. "A survey on Testing and Monitoring Methods for Stator Insulation Systems of Low-Voltage Induction Machines Focusing on Turn Insulation Problems," IEEE Transactions on Industrial Electronics, Volume 55, No. 12, pages 4127-4136, 2008. The detection of a deterioration of an insulation, that is in particular between individual windings of a coil, is principally described as 'possible using offline tests'; an example of an online test for machines of this type is the so-called PD method (PD—Partial Discharge), a disadvantage of which is the additional expensive equipment necessary for its use. The main conclusion obtained from this citation is, however, the fact that offline methods, such as, in particular, the so-called Surge Test, are particularly effective. A disadvantage of such off-line testing is that these checks or tests cannot be carried out continuously, but only at relatively long time intervals. It would be important, however, to provide a more or less continuous monitoring, i.e., an online monitoring, to detect any deterioration in the state of insulations.

From Grubic S. et al., "A New Concept for Online Surge Testing for the detection of Winding Insulation Deterioration", Energy Conversion Congress and Exposition (ECCE), pages 2747-2754, 2010, a concept for online-testing with regard to the detection of a deterioration in a winding insulation is known. In this technique, different forms of connection and disconnection of electrical components, in particular inductors, in the voltage supply circuit (feed circuit) are proposed, also, for example, the additional isolation of the motor from the power supply. In this case it is also necessary to apply a plurality of pulses with increasing voltage level to the motor. This technique is relatively complex and time-consuming.

JP 2010-268645 A describes a technique for testing insulations in AC motors, in particular those of motor vehicles. Specifically, here it is the state of the winding insulation of the electrical machine with respect to the machine housing, i.e. ground, which is detected, wherein the current at a neutral point (zero point) is always detected; in this case transients of this zero-point current as a result of an excitation can also be evaluated, with a damping factor being calculated. The required parameter can be detected either by measuring the total current between inverter and machine, or by measuring the current between machine housing and ground, or by measuring the current between inverter housing and ground, with a separate, additional sensor being necessary in each case. Detecting of a deterioration of the insulation is only possible by a comparison of measurements from at least two motors.

From U.S. Pat. No. 6,483,319 B1 a method for performing broadband impedance response tests in order to detect any impending failure of a stator winding is known. The impedance response can be obtained by applying discrete frequencies to the stator winding, albeit resulting in a low resolution.

In WO 03/087855 A1 the measurement of currents in a motor controller is described, where in order to reduce the signal-to-noise ratio, the provision of oversampling in the measurement signal is also disclosed. The investigation of insulation states is not addressed in this document.

RU 2208236 C2 describes, in the context of a diagnosis of the insulation of windings of electric motors, the evaluation of the voltage signals of a steep voltage wave, which requires in addition a voltage meter to be installed at the terminals of the motor.

Also to be mentioned here is the older, not pre-published, EP application 10450114.3, or its corresponding PCT application WO/EP2010/061502 (cf. also P. Nussbaumer et al. "Saliency Tracking Based Sensorless Control of AC Machines Exploiting Inverter Switching Transients", Proceedings of IEEE Symposium on Sensorless Control for Electrical Drives, SLED, 2010, pages 238-242), where—unlike the case of the present problem of insulation monitoring—the discovery of asymmetries in an AC current machine using transient time derivatives of the current is disclosed, which are caused in the winding of the machine by the application of voltage steps to it. In that case the transient characteristic of the derivative of the current in time is sampled with a relatively high sampling frequency, in order to obtain maximally meaningful digital values for the temporal current variation relative to a short observation window. Developing insulation faults cannot be found with this method however.

Thus, it is an object of the invention to propose a method, and a device, respectively, as initially defined, with which a reliable online detection of deteriorations of the insulation state within an electrical machine can be carried out, wherein moreover the design and constructional complexity should be able to be kept as low as possible.

The invention is based on the fact that the configuration of a drive system with an inverter and an induction machine is represented by a complex network of resistors, inductors and capacities. As such, the topology and design of the inverter, for example, exerts an influence on its parasitic capacitive coupling to ground. The insulation of the machine affects the parasitic capacitances of phase to ground, phase to phase and winding to winding (general winding insulation or insulation of the individual windings from each other, the so-called "inter-turn insulation"). The very short rise times of the voltage pulses that are applied when connecting the inverter to the machine windings, lead to reflections and thus to high-frequency oscillations, and not only in the applied voltage, but similarly also in the current induced in the respective windings. If an element in the above-mentioned complex network then changes, in particular by a deteriorating inter-turn insulation, the entire system becomes "detuned", in which case a change is produced in the above-mentioned high-frequency, transient oscillations of the current.

On the other hand, it is worth noting that most modern drive systems already comprise current sensors in the supply circuit, or sensors that detect the temporal derivative of the current, wherein these sensors are also intended to be able to be used in the present technology of online-detection of deteriorations in the state of insulations.

To achieve the given object, the invention provides a method and a device as specified in the independent claims. Advantageous embodiments are the subject matter of the dependent claims.

At a more detailed level, the invention provides first and foremost a method for the online detection of a deterioration in the state of an insulation in an electrical machine, wherein by means of an inverter, a stepwise voltage is applied to the winding(s) of the machine and the resulting current and/or the time derivative thereof is detected as a measurement signal by means of at least one sensor and is then oversampled at a frequency relatively high as compared to the characteristic frequencies for a transient oscillation, following which the signal obtained by the oversampling is analysed with regard to characteristic parameters of the transient process, such as overshoot and/or natural frequency and/or damping constant, in order to detect a possible deterioration of an insulation.

In a corresponding manner, the invention provides a device for the online detection of a deterioration in the state of an insulation in an electrical machine, wherein a supply circuit having an inverter and at least one sensor is assigned to the electrical machine in a current conductor to the machine, which sensor, on application of a stepped voltage, detects the current induced in at least one winding of the machine or the temporal derivative thereof as a measurement signal, wherein the sensor is connected to an oversampling device for oversampling the measurement signal at a comparatively high frequency relative to transient processes and the samples obtained are fed to a computer unit for determining characteristic parameters of the transient process on application of the stepped voltage, such as overshoot and/or natural frequency and/or damping constant, in order to detect a possible deterioration of an insulation.

The proposed technique for insulation fault detection, or detection of a deterioration of an insulation, therefore uses changes in the "step current response" to the applied stepped voltage, such as natural frequency or damping rate, overshoot, but also—for the actual fault detection—makes use of values in the stationary state (steady state) following a change in an element of the above complex system caused by an (incipient) fault, for the purpose of insulation monitoring. The step response to the inverter switching operation is detected with current sensors, or alternatively with current derivative sensors, preferably with sensors that already exist in the supply circuit of the machine. In this context, it is advantageous that in the present technique, phase currents are evaluated, so that separate sensors can be avoided. In addition, it is also possible to apply different inverter switching operations and to detect the system response to these stepwise voltage changes, and with relatively high sampling rates, in the range of several MHz (or Ms/s—megasamples per second), wherein changes in the characteristic parameters of the high-frequency current transient can be detected. Particularly preferred sensor types used are so-called Rogowski-type sensors, with which the temporal derivative of the currents can be detected. These Rogowski sensors are also designated as CDI-sensors (CDI—Current Derivative Inspector). In previously carried out tests, sampling rates of 40 MHz proved favourable, while the oscillation frequencies of the induced current oscillations were, for example, on the order of 100 or 200 kHz.

An advantage of the present technique also lies in the fact that apart from the insulation between the winding and ground, the insulation between the phases as well as the insulation between the turns of individual phases can be detected. Differences in the impedance between the inverter (converter) and motor, which lead to reflections of the steep voltage wave at the individual turns of the winding, are detected in the corresponding phase current signals. In this context moreover, it is also an advantage that the test for a deterioration of an insulation is also possible in the case of only one electrical machine, wherein by comparison of the characteristic parameters of the individual phase currents of the motor, a deterioration of the winding insulation of a phase can be detected in the form of an asymmetry of the insulating characteristic.

The high-frequency oversampling described can be implemented using, for example, high-frequency sampling A/D-converters (hereafter also abbreviated as "ADC"), which are to be used in addition to the low-cost current sensors or current derivative sensors.

For the (actual) data processing, conventional, low-cost logic circuits or computing resources can be used, so that the outlay required for implementing the invention is extremely low and cost-effective.

Nevertheless, for the first time a continuous, secure detection of faults in a winding insulation is thus facilitated as soon as they arise, if a weakening of the isolation, a change in the insulation capacity, the resistance, or the inductance etc. is present. As mentioned, the inter-turn insulation is particularly critical here, and a short circuit between turns is considered a particularly critical fault, which especially in large machines requires an immediate response in order to prevent a complete destruction of windings and lamination cores. This problem scenario can be solved with the invention, and without the previous considerable additional effort, such as special wiring of the machine and inverter, without the previously required high-precision current sensors, and in particular without the typical interruptions to operation.

Characteristic parameters of the transient process applied in the present technology are in particular the overshoot or the natural frequency of the oscillation, and as an alternative to the natural frequency or supplementary to it, the damping constant of the transient oscillation can also be used. With these characteristic parameters, an incipient fault in the insulation can be immediately and reliably detected.

As to this, for reliable detection it has proved to be a considerable advantage if the characteristic parameters obtained by the analysis are compared with corresponding parameters which have been obtained in a previous measurement process with a properly functioning machine. Such a comparison can be carried out easily and therefore yields a direct indication of changed system responses, if the compared parameters are different.

For a simple online detection, in addition to, or instead of, it is also favourable if the parameters obtained are compared with predefined threshold values which, if exceeded, would result in a fault condition being decided upon. The predefined threshold values for each individual machine can be determined in advance on the basis of simple calculations or tests, with a fault condition or an incipient fault only being decided upon when these thresholds are exceeded; this means deviations in the characteristic parameters lying within tolerance limits will be eliminated as spurious indicators for developing faults. For example, changes in the characteristic parameters caused by operationally induced heating can also be taken into account.

The natural (characteristic) frequency can be obtained quite simply by determining the time interval between successive extreme values of the signal to be measured. In a similar manner the overshoot can easily be determined as the difference between the value in the steady state and the (first) extreme value in the (oversampled) signal.

With the present technique, already existing faults, that is to say, not just incipient, insulation faults can also be detected, where it is advantageous if for the detection of actual insulation faults, the stationary (steady) state of the signal is used as a characteristic parameter. It is also advantageous for simple error detection if, in the case of the detection of the time derivative of the induced current, the value of the signal in the steady-state condition is determined as the last measured value when a constant voltage is applied. On the other hand, it is also advantageous for this purpose if in the case of the direct detection of the induced current, the value of the signal in the steady-state condition is determined via two distinct samples and the slope defined by these in the signal.

An advantageous embodiment of the present method is then characterized by the fact that a plurality of measurement processes are undertaken with application of a stepped voltage and a statistical evaluation of the results obtained is carried out. This allows more characteristic information regarding detection of (incipient) faults to be obtained, while at the same time also improving the reliability of the detection.

As far as the present device is concerned, this is similarly characterized for the simple identification in a particular manner by at least one comparator unit, which is used to compare the characteristic parameters obtained with corresponding stored parameters of the machine when functioning properly, and/or with a predefined threshold. An evaluation unit is advantageously connected to the comparator unit, for detecting or identifying deteriorations of an insulation and, if appropriate, insulation faults.

To provide temporal delimiting of the online tests carried out on the essential processes involved in activating the transient phenomena, a window circuit is advantageously provided between the oversampling device and the (actual) computing unit, wherein the window circuit has a control input connected to a control unit controlling the inverter and specifies a predefined observation window starting with a control signal from the control unit, in which the samples are supplied to a further processing stage.

As has already been indicated, in the present case the computing unit can be implemented with simple, low-cost components, wherein an embodiment with an FPGA component (field programmable gate array) is particularly advantageous. Where necessary, a digital signal processor (DSP) can alternatively or additionally be provided for carrying out at least a part of the calculations.

Figure 1:
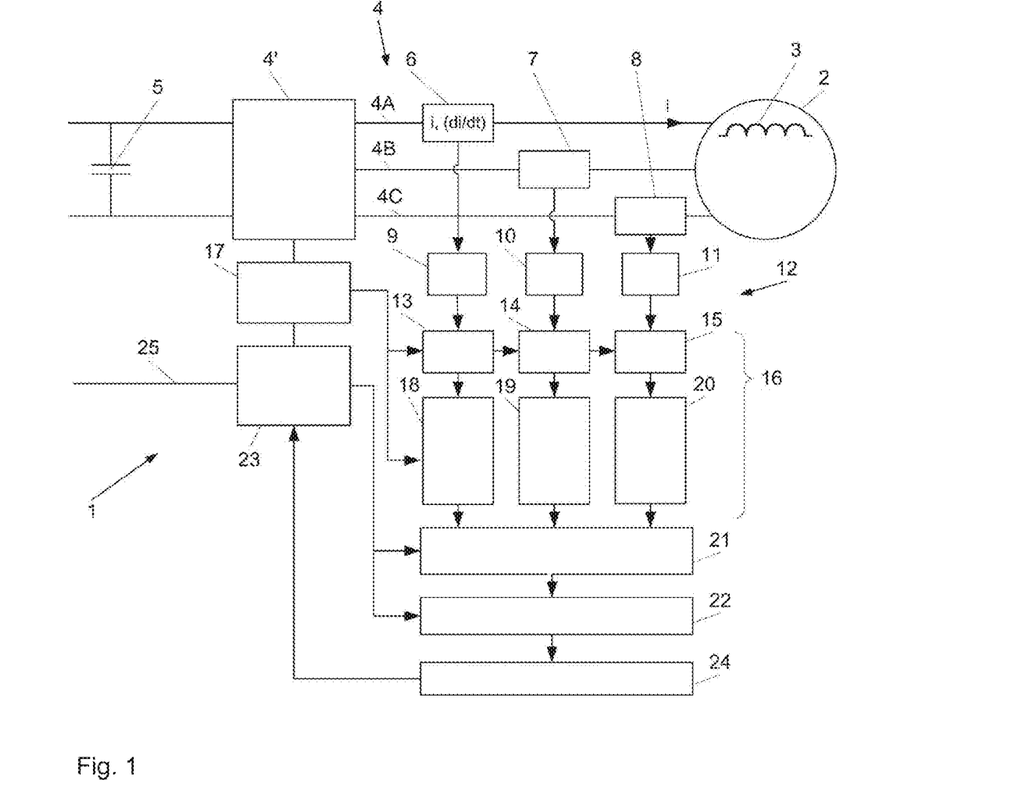
FIG. 1 a schematic of an embodiment of the device according to the invention in block diagram form.

The invention is further described hereafter, based on particularly preferred exemplary embodiments, by which it is not intended to be limited, and with reference to the drawings. These show:

FIG. 1 shows a schematic of a preferred embodiment, particularly suited to carrying out the present method, of a device according to the invention for the online detection of deterioration in states of insulations in an electrical machine.

The device 1 shown in FIG. 1 is used for the online monitoring of an electrical machine 2 (induction machine), which can be single- or multi-phase, where in FIG. 1, for example, three phases are assumed, even if schematically in FIG. 1 only a single winding 3 is shown for the machine 2. This machine 2 has a supply circuit or feed circuit 4 assigned to it, with three current supply lines 4A, 4B and 4C, corresponding to the three phases; this supply circuit 4 also comprises an inverter 4' which provides the corresponding voltage signals for the machine 2; in addition, a DC terminal capacitance 5 associated with the inverter 4' is illustrated.

In the individual phase conductors 4A, 4B, 4C, corresponding sensors 6, 7, 8 are arranged, which in the present case, for the present technique, serve to detect the current i or the time derivative of the current, di/dt, in the individual phases 4A, 4B, 4C. The current derivative sensors can be, for example, Rogowski-sensors, known per se, also known as CDI-sensors. Current sensors on the other hand are also known and need no further explanation here either.

The output signals of the sensors 6, 7, 8 are fed as measurement signals to an oversampling device 12, which is implemented with A/D-converters (ADCs) 9, 10, 11, one for each phase 4A, 4B, 4C. The sampling rate is high enough to ensure an accurate determination of the measurement signals during the transient response, during the switching transitions. As mentioned above, the sampling frequency used can be several 10's of MHz, 40 MHz, for example, but for some applications, only a few MHz, up to 10 MHz, for example, may be adequate.

The output signals of the ADCs 9, 10, 11 are then fed to window circuits 13, 14, 15, which are part of a processing unit 16 and specify observation windows, i.e., time intervals for the measurement signals to be analysed after they have been sampled. For this purpose, the window circuits 13, 14, 15 are connected to a control unit 17 for the inverter 4', wherein this control unit 17 is, for example, a pulse width modulation (PWM) control unit and outputs corresponding switching commands to the inverter 4', in a manner known per se. Based on these switching or control signals, the respective observation window, i.e. the relevant observation period, is then fixed in the window circuits 13, 14, 15, and on reaching the end of the respective window the evaluation, i.e. the feeding, of samples from the ADCs 9, 10 and 11 to actual computer components 18, 19, 20, is terminated.

It is in these computer components 18, 19, 20, i.e. in general, in the actual computing unit 16, where characteristic parameters relating to the transient process of the signals, i.e., specifically here the current signals or the signals indicating the time derivative di/dt of the current, are calculated, such as, in particular, overshoot and natural frequency or damping constant. Moreover, the value of the signal in the stationary, i.e. in the steady state condition, can also be determined here.

The characteristic values obtained are then fed to a comparator unit 21, where a comparison with corresponding characteristic parameters is carried out, the latter parameters having been obtained previously in a measurement operation on a correctly functioning machine 2.

Following this, in a further comparator unit 22 the identified characteristic parameters are compared with predefined thresholds, which can be supplied, for example, via a machine controller 23 or stored in advance in a memory (not shown). The machine controller 23 can also be connected to the first mentioned comparator unit 21.

After the comparisons have been carried out, in an evaluation unit 24 the final analysis of the signals is made, i.e., the detection of an (incipient) fault and its identification, in particular using the preceding comparison results.

In the first comparator unit 21, during the comparison with the parameters of the machine 2 obtained in the normal state, operating point-dependent changes or asymmetries in the phases are eliminated. Any other deviation of the phase signal from the normal state is stored, however, and subjected to the threshold comparison in the comparator unit 22. If the signal parameter there, i.e. the characteristic parameter, is above the threshold value, a corresponding message is received regarding fault detection and identification in the control unit 24 and the result is fed, for example, to the machine controller 23 in order to initiate appropriate measures, such as emergency operation or a system abort.

The machine controller 23, in addition, is supplied at 25 with a reference value for the processes to be controlled.

Figure 1A:
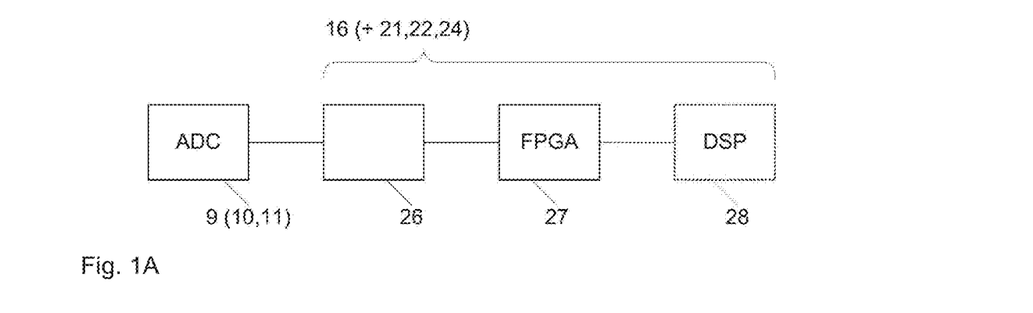
FIG. 1A a part of a detector circuit or computing unit of such a device in a more concrete, somewhat modified embodiment.

FIG. 1A shows, in a simplified arrangement, namely for a single phase, a chain of units for the oversampling and signal processing, including the above mentioned comparisons and signal analysis. In particular, an A/D-converter is shown there, such as the ADC 9 (also 10, 11 as appropriate), which is connected via a buffer memory 26 to a logic module in the form of a field-programmable gate array (FPGA) 27. The purpose of this buffer memory 26 is to buffer the output data output by the ADC 9 at a high data rate, since the FPGA module 27 typically cannot handle such a large amount of data directly.

As also illustrated in FIG. 1A with dashed lines, a digital signal processor (DSP) 28 can also be connected for various calculations and evaluations, as far as those cannot be carried out by the FPGA logic module 27 itself.

As mentioned, by applying different inverter switching operations and by measuring the system response to these steep, stepwise voltage changes, when sampling at a high sample rate with a frequency of several MHz, changes are detected in the characteristic parameters of the high-frequency current transient.

Figure 2:
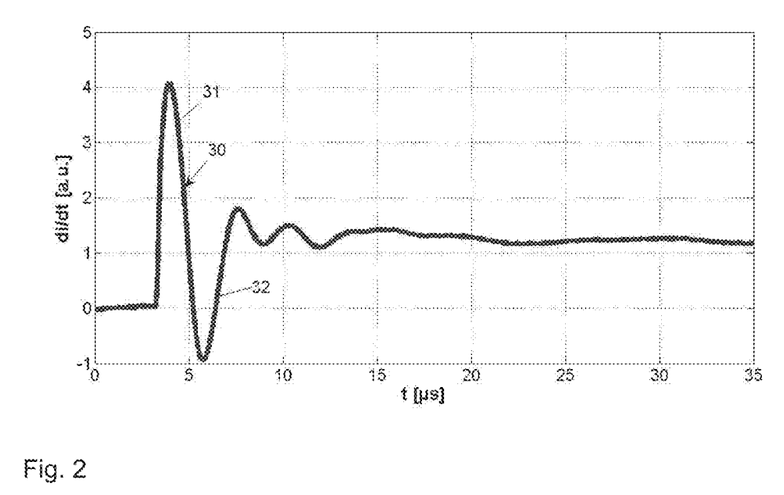
FIG. 2 a schematic view of a measurement signal, such as is obtained with a Rogowski sensor (CDI-sensor), and which shows the time derivative of the induced current, di/dt, in arbitrary units ("a.u.")

FIG. 2 shows an example of a measurement signal obtained by means of a Rogowski sensor 30 for di/dt, with arbitrary amplitude units (a.u.). As can be seen here the system is triggered out of the inactive state (initial value 0) by a positive voltage pulse from the inverter 4' (see FIG. 1), and the current i induced in the respective winding, e.g. the winding 3 in accordance with FIG. 1, or the time derivative thereof di/dt, then displays a short-term transient effect, after which a steady state, stationary condition, is reached, for example, at a value just above 1 in accordance with FIG. 2.

The measurement signal 30 in accordance with FIG. 2 was obtained, as mentioned above, by means of a Rogowski sensor as the sensor 6 (or 7 or 8), using oversampling with in this case, for example, a sampling rate of 40 MHz.

Figure 2A:
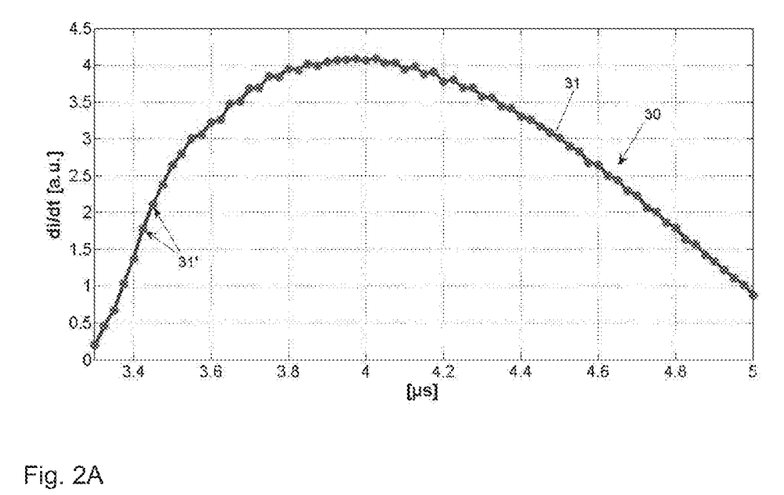
FIG. 2A an excerpt from the di/dt-signal of FIG. 2 in a time-expanded scale, to illustrate the high-frequency sampling points for this signal in a practical ratio of the high oversampling frequency relative to the frequency of the transient process.

This oversampling is illustrated schematically in FIG. 2A, wherein specifically in FIG. 2A the first, positive overshoot 31 is illustrated in an expanded time scale (compared with FIG. 2) and wherein the individual sampling points are illustrated by points 31'. As can be seen, the sampling rate or frequency is substantially higher than the frequency of the transient process, such as is defined essentially by the positive overshoot 31 and the negative overshoot 32 Illustrated in FIG. 2. The natural frequency defined by these overshoots 31, 32 can lie, for example, in the order of magnitude 200 kHz, whereas as mentioned, the sampling frequency—in the tests carried out—was 40 MHz.

The measurement can be carried when the machine 2 is stopped, as well as during a machine start-up, but it can also be carried out during the operation of a machine, if in the course of the PWM-control of the machine 2, when each individual voltage pulse applied, individual short transients 31, 32 for the winding current i or its temporal derivative di/dt are produced.

Figure 3:
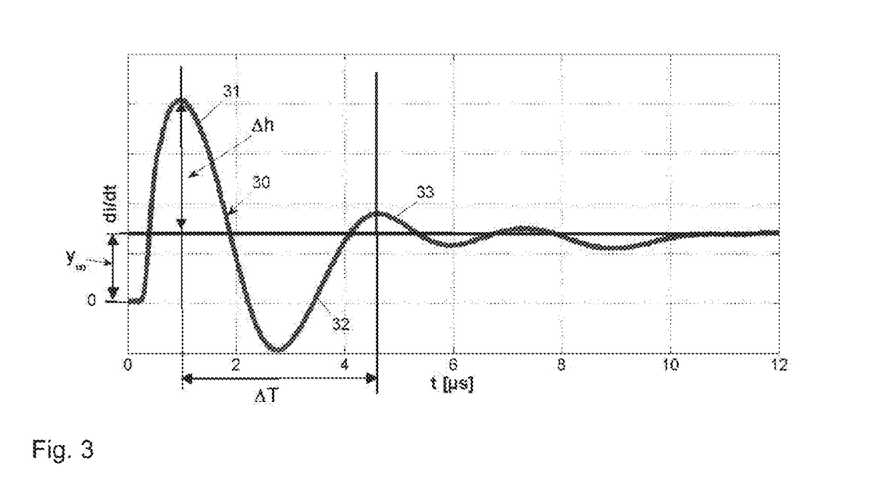
FIG. 3 a similar signal to FIG. 2, i.e. a time derivative of the induced current, with characteristic parameters drawn in, namely $\Delta T$ as the reciprocal of the natural frequency of oscillation, an overshoot $\Delta h$ and a steady-state value $Y_\infty$.

In FIG. 3 a corresponding measurement signal 30 for di/dt over time t is shown, wherein from any starting value, e.g. a value of 0, the machine is switched on by applying a positive voltage step, and wherein an overshoot is produced which goes beyond the steady-state condition $y_\infty$ that is to be reached. The first overshoot (overshoot 31) is designated as Δh.

After an overshoot into the negative range (overshoot 32) a slight overshoot again occurs into the positive range, at 33, resulting in a period ΔT as the inverse value of the natural frequency. In the example shown, ΔT is approximately 3.5 µs, which indicates a natural frequency of 286 kHz.

This natural frequency can thus be detected in a simple manner from the signal waveform di/dt shown in FIG. 3 over the time t, obtained using a Rogowski sensor and after sampling (see FIG. 2A), i.e. determined in the computing components 18, 19, 20.

The same is true for the overshoot Δh as a value between the first amplitude during the transient oscillation over the (final) steady-state condition $y_\infty$.

Finally, the steady state condition $y_\infty$, i.e., the steady-state value $y_\infty$ that is finally obtained, can also be measured, apart from the fact that this value, for an intact machine 2, is known from the outset for the respective applied stepped voltage, or else, if only a short measurement time is assumed, can be obtained by averaging the measurement signal.

Figure 4:
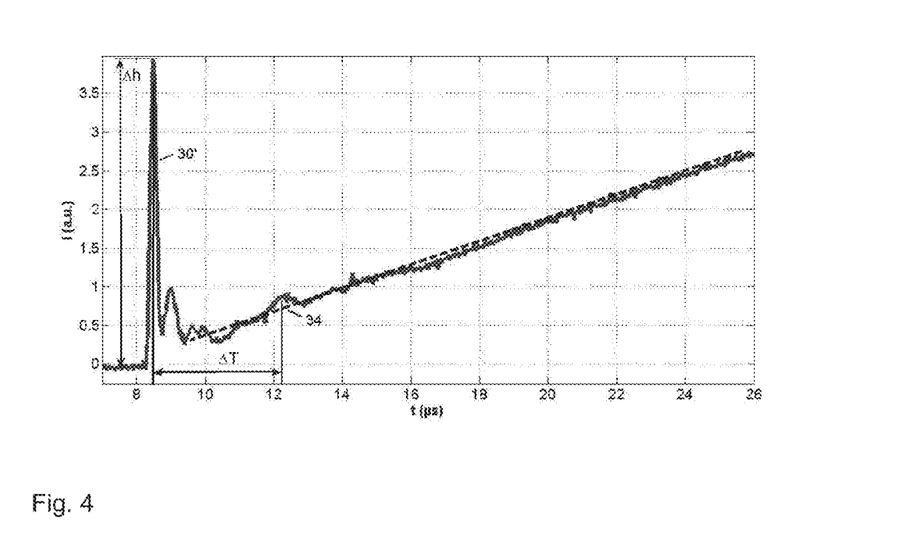
FIG. 4 schematically a comparable measurement signal over time, as is obtained with a simple current sensor, wherein $\Delta h$ and $\Delta T$ are also illustrated.

Before going into the details of the individual analysis processes, reference will be made to FIG. 4 as an alternative example of a measurement signal 30', in which the—actual—current i, which was detected by the sensor 6, 7, 8, is shown over the time period t. The period ΔT, as the inverse of the natural frequency for the transient process, and the overshoot Δh are also illustrated. Here, too, the amplitude is again given in arbitrary units ("a. u."). In FIG. 4 alongside the measurement signal 30', a mean straight line is shown with dashed line 34, and a positive gradient, the time derivative of which illustrates the steady-state condition.

Hereafter, before reference is made to specific test results with reference to FIG. 5-9B, the calculation of characteristic parameters, such as natural frequency, overshoot and steady-state condition, will be briefly discussed.

The natural frequency (1/ΔT) of the transient system response, such as is given in the current signal i(t) or in the signal of the current derivative in time, di/dt, can be calculated by the application of different known algorithms. A simple and very effective way, in particular with regard to real-time calculation, is the determination of the extreme values of the transient process, which can be identified in the measurement signal 30 or 30'. This can, as mentioned above, be carried out in a manner known per se, for example with fast and robust algorithms, and leads to a direct calculation of the natural frequency.

Another, slightly more elegant and more accurate calculation method is possible by calculation of the inherent frequencies by application of a Fast Fourier Transform (FFT—Fast Fourier Transformation).

An accurate selection of the parameters for the respective window function is also important here; the observation window is advantageously specified up to the value of the steady-state condition, but it can also be shorter, so that there is less data to process. For example, the window can be selected to be just slightly larger than ΔT.

In FIG. 3 and FIG. 4, as mentioned above, the inverse of the natural frequency ($f_0$) is indicated as ΔT for both sensors (CDI-sensor in FIG. 3 and absolute value current sensor in FIG. 4).

The same methods as are applied for the calculation of the natural frequency $f_0=1/\Delta T$ by determining the extreme values of the transient waveform of the current, or the time derivative di/dt of the current, using fast, simple algorithms can be used to calculate overshoot values of the signal. If the signal waveform of FIG. 3 (time derivative of the current, di/dt) is considered, then the difference between the first extreme value and the steady-state condition represents the first overshoot 31. In FIG. 3 the value for the first positive overshoot is labelled with Δh (in the case where CDI-sensors are used). If standard sensors are used, which measure the absolute current value over time, see FIG. 4, then it is clear that the decay of the transient signal waveforms follows a virtually straight trajectory. Therefore, no steady-state signal condition is reached during the application of voltage steps in the relevant time period of a few microseconds considered here. During an active switching the current increases continuously in this period, in this time window, see signal 34, and only the time derivative of the current reaches a steady-state value. The maximum value during the switched-transient process in the current signal relative to the last current value before the change of switching state can be considered as the first positive overshoot Δh (FIG. 4).

If the voltage step is applied for long enough, namely long enough for the steady-state condition of the time derivative of the current to be reached, the value $y_\infty$ of the steady-state condition of the signal can of course be easily determined. In the case of sensors for the temporal derivative of the current (Rogowski sensors), the value of the steady-state condition is the final measured value when a constant voltage level is applied. This could also be implemented directly, without high-frequency A/D-converters, and the signal accuracy can be increased if the value of the steady-state condition is detected by averaging over multiple such final readings.

If sensors which directly measure the current are used, the value of interest is the steady-state condition of the slope of the current curve, see curve section 34 in FIG. 4. Here, the calculation can proceed such that at least two current values are taken, with the time difference between the two values being large enough to enable an accurate determination of the time derivative of the current, i.e. the slope of the straight line 34 in FIG. 4.

A further advantage of oversampling A/D-converters 9, 10, is the possibility of applying averaging techniques, thus allowing the accuracy of the detection to be increased.

In the case of a deteriorating insulation, the value in the steady-state condition will not change in comparison to that of an intact machine. However, as soon as a turn short-circuit occurs, that is, a short circuit from turn to turn, the measurements show that the value of the steady-state condition changes substantially, even if only one turn in a single phase is shorted.

Accordingly, the calculation of the value $y_\infty$ of the steady-state condition is particularly suitable for calculating an already existing fault in the insulation.

Practical tests have been carried out on a 5.5 KW squirrel-cage rotor induction machine, wherein tapping points of different turns of the three turns of the machine were accessible. By connecting such tapping points to a corresponding terminal of the machine, it is possible to short-circuit a variable number of turns, to simulate an inter-turn insulation fault in the stator which is not sufficient to destroy it. Now, if instead of a direct connection, an additional capacitance, a fault capacitance $C_F$, is inserted between corresponding terminals, a degraded insulation from turn to turn is simulated. Such an approach is shown schematically in FIG. 5, where three windings 35, 36, 37 are shown, corresponding to phases U, V, W. In dashed lines, both the capacitances between the individual phases, $C_{ph-ph}$, and the capacitances between the individual phases and ground, $C_{ph-gnd}$ are shown. In addition, a capacitance $C_{t-t}$ is shown schematically with a dotted line, as a normal capacitance between two successive turns.

Figure 5:
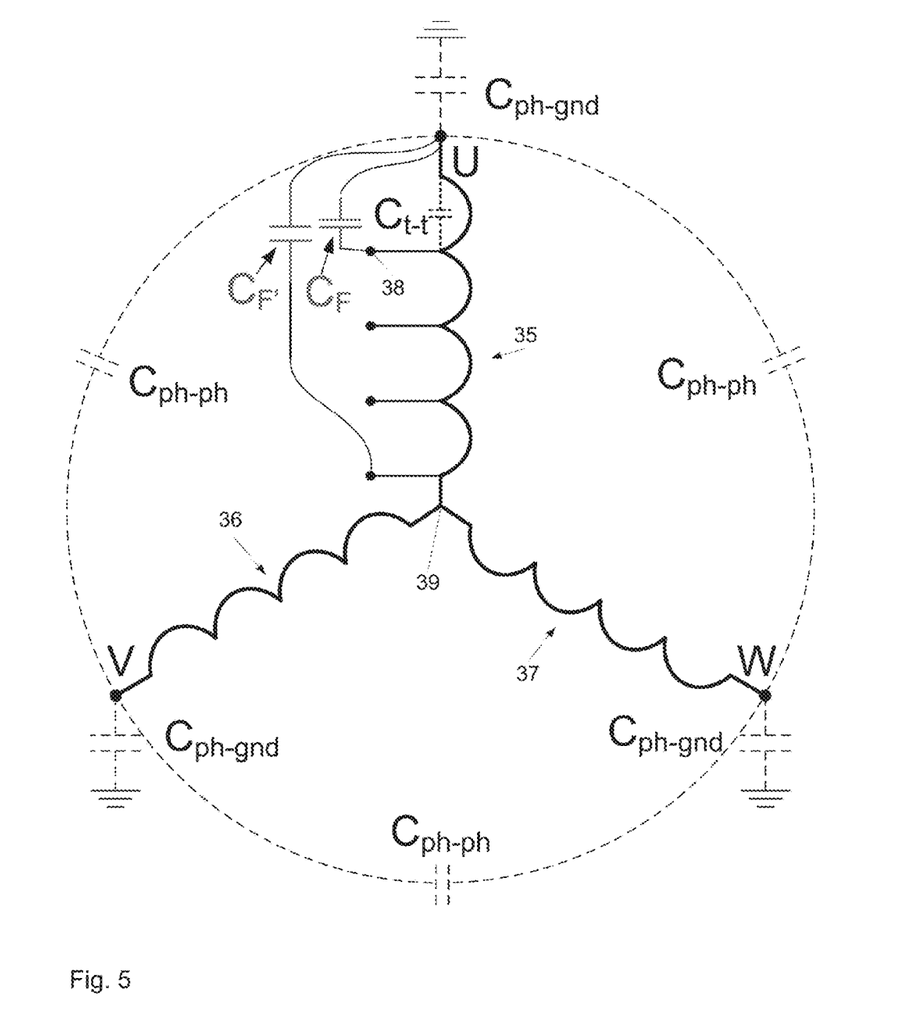
FIG. 5 schematically the arrangement of three windings of an electrical induction machine, with two disturbance capacitances (fault capacitances) $C_F$, $C_F'$ between the first tap point of a phase winding and ground, and a neutral point of the three phase windings U, V, W and ground.

In addition, two fault capacitances $C_F$, $C_F'$ are now shown, firstly, a fault capacitance $C_F$ between a first tap 38 of the winding 35 and the phase connection U, and, secondly, a fault capacitance $C_F'$ between the neutral point 39 and the phase connection U. The additional capacitance $C_F$, or $C_F'$ parallel to the turn capacitance, e.g. $c_{t-t}$, increases the (fault) capacitance due to the turn insulation. A corresponding increase in the capacitance can be detected in the case of a deterioration of the dielectric properties of the insulation. During the test, to obtain a more detailed identification of the properties of the insulation system of the induction machine, the phase to phase capacitances $C_{ph-ph}$ was defined as 500 pF and the phase-ground capacitance $C_{ph-gnd}$ as 1 nF.

In the tests the oversampling was carried out with a frequency of 40 MHz, by means of 16 bit A/D-converters. The communication with an FPGA-component 27 took place via data buffer 26 (FIG. 1A).

In initial tests, cf. FIG. 5, a fault capacitance $C_F$ was inserted between the first tap 38 of the U-winding 35 and the phase connection.

Figure 6:
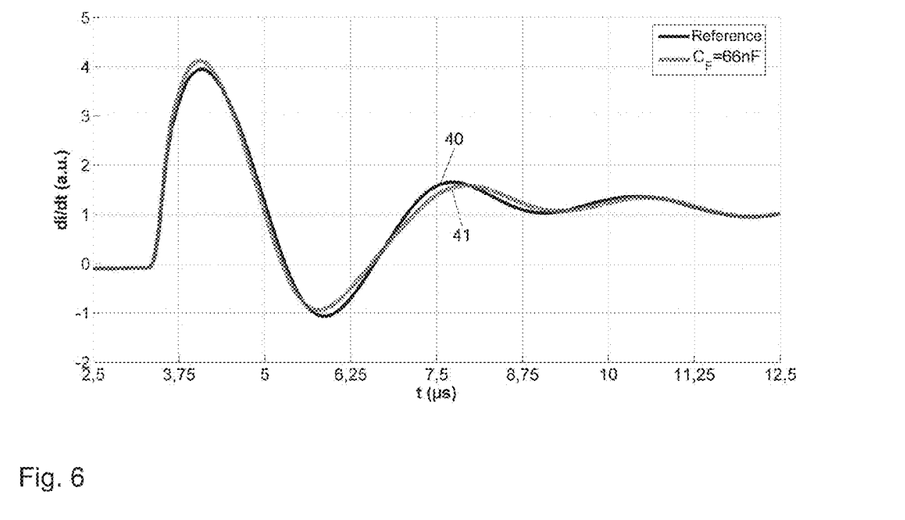
FIG. 6 a current derivative response obtained in such a test arrangement with a fault capacitance $C_F$ between the first tap point and ground, wherein both a reference curve and the measurement signal curve resulting from the presence of the fault capacitance are shown, this illustration corresponding to the machine switching over from the inactive state into the active state.

FIG. 6 shows the signal waveform thus obtained, measured with a Rogowski sensor for the time derivative of the current di/dt, in curve 41, wherein a reference curve 40 for the signal waveform of the intact machine is also illustrated. As can be seen, different signal waveforms are obtained for the two curves 40 (reference) and 41 (with fault capacitance $C_F$). The fault capacitance was, for example, $C_F$=66 nF.

From the signal waveform of FIG. 6 it can also be discerned that, as expected, the change in the turn capacitance cannot be detected on the basis of the measurement signal values in the steady-state condition, because the two signal waveforms yield identical values in the steady-state condition. However, a clear difference in terms of overshoot and natural frequency can be discerned from FIG. 6. This difference is only discernible when the voltage phasor of the active switching state is pointing along the phase axis of the "degraded" phase U (in this example). A final point to mention is that the switched-transient processes—as has been demonstrated—exhibit only very small statistical variation. Each signal waveform shown in the present figures corresponds to a mean value obtained on the basis of 240 measurements.

Figure 7:
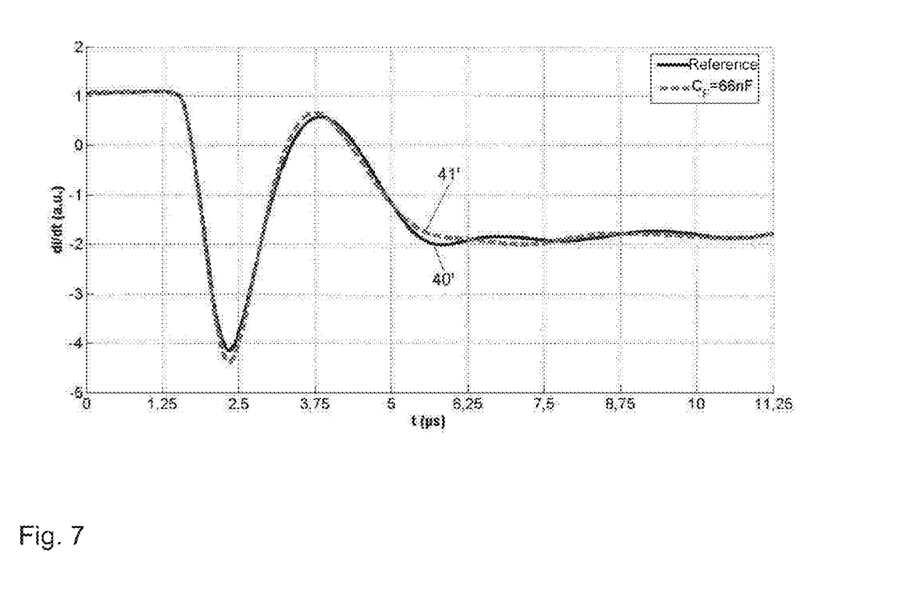
FIG. 7 a corresponding di/dt-signal similar to FIG. 6, first as a reference and secondly as a "fault" measurement signal, in the presence of a fault capacitance $C_F$, but this time during a switch-over by means of the inverter from one active state with a positive value, into another active state, with a negative value.

For comparison purposes, FIG. 7 shows a signal waveform—reference signal 40' and measured waveform 41'—for the case in which a switching process takes place by means of the inverter 4' from an active state in the positive range into an active state in the negative range (e.g. from approximately +1 to approximately −2). By contrast, FIG. 6 illustrates the waveform of the signals 40, 41 during a switching process of the inverter 4' from an inactive state 0 in an active state (steady-state value approximately +1).

Also in the case of FIG. 7, a fault capacitance $C_F$=66 nF was connected between the first tap 38 of the coil 35 and the phase connection U. Also clearly discernible here are, firstly, the (at first negative and then positive) overshoot of the waveform 41' in comparison to the reference signal 40', and secondly the change in the natural frequency in terms of the shift in the time interval ΔT.

In another test comparable measurements were made with, on the one hand, an inserted fault capacitance $C_F$ between a tap in the middle of the winding of phase U (50% short-circuit), or between the neutral point 39 and the phase connection (fault capacitance $C_F'$, corresponding to 100% short-circuit), wherein the fault capacitances were 1 nF in each case. From the corresponding signal waveforms in FIG. 8, again measured with Rogowski sensors (di/dt-sensors) and obtained after oversampling at 40 MHz, the differences between the reference signal 50 and the signal 51 in the case of a 50% short-circuit (fault capacitance $C_F$), on the one hand, and the signal 52 in the case of a 100% short-circuit, fault capacitance $C_F'$, can be clearly identified. As can also be discerned there, by detecting the changes the natural frequency can be identified in the waveforms shown approximately following the first period of the transient decay.

In order to examine the reliability of the detected switched-transient processes, the statistical properties of the sensor signals were investigated. In each configuration, as mentioned above, 240 measurements were made on the machine or coil respectively, and the results and/or signal parameters were compared.

Figure 8:
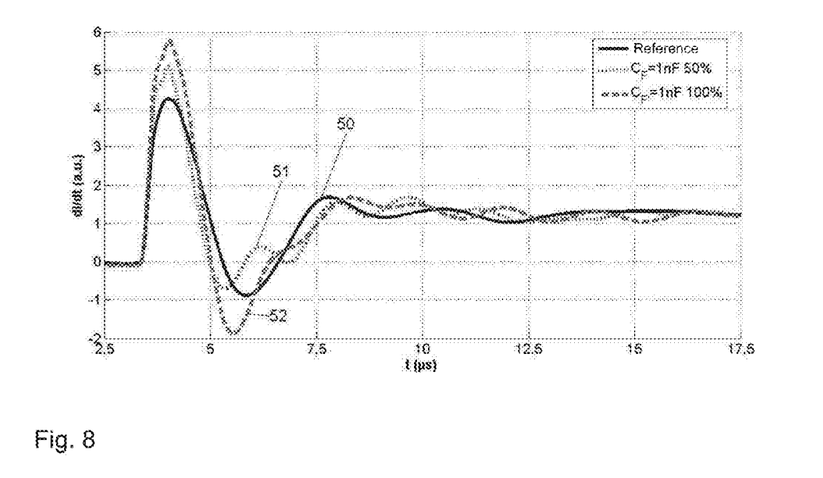
FIG. 8 a diagram similar to FIG. 6, where now, apart from a reference signal, measurement signals are shown both in the presence of the fault capacitance $C_F$, and in the presence of a fault capacitance $C_F'$.
Figure 9A:
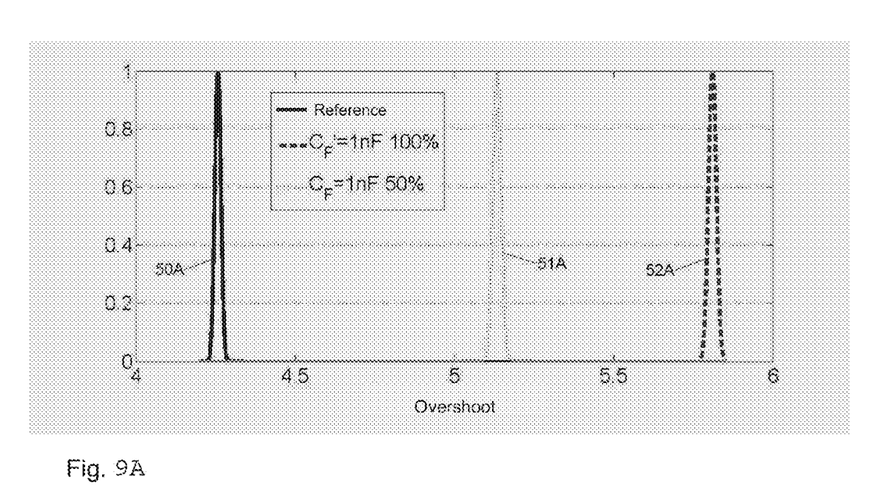
FIGS. 9A and 9B schematic diagrams illustrating statistical signal characteristic parameters of measured circuit transient processes, namely overshoot (FIG. 9A) and natural frequency (FIG. 9B), where in each case three curves are illustrated: a reference, the curve for a fault capacitance $C_F'$—dashed line—and additionally that for a fault capacitance $C_F$,—dotted line, and wherein a statistical analysis of 240 measurements is given.

Corresponding to the signal waveforms in FIG. 8, FIG. 9a (with respect to overshoot distance) and 9B (with respect to frequency or natural frequency) schematically illustrate a normalized probability density of the signal characteristics, as were obtained from the switched-transient processes as previously explained. The overshoot distance (Δh in FIG. 3) is shown at approximately 4.3 for the reference (overshoot 50 A), the first overshoot 51A for the signal 51 is shown in FIG. 9A at an overshoot distance of a little over 5, and the first overshoot 52A in the signal 52 is shown in FIG. 9A with an overshoot distance of approximately 5.8.

Figure 9B:
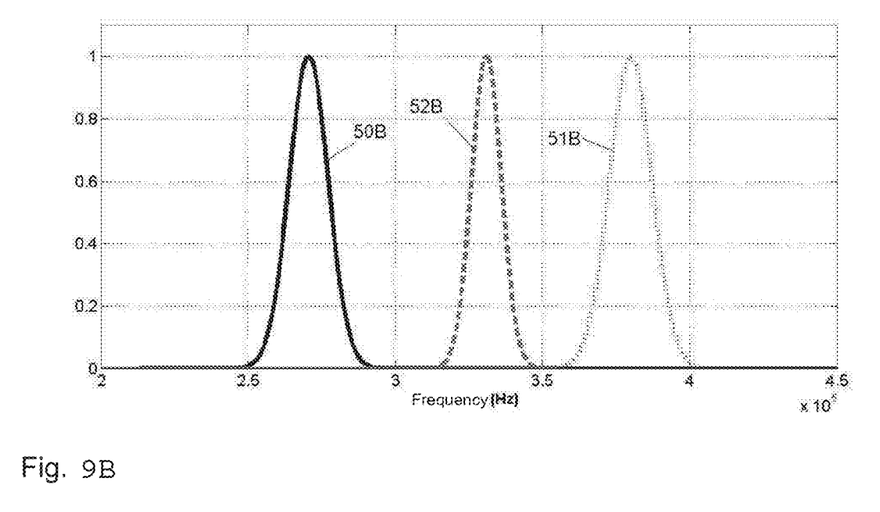

As far as the natural frequency is concerned, corresponding frequency values 50B, 51B, 52B are illustrated in FIG. 9B, which are approximately 0.27 MHz for the natural frequency in the case of the reference curve 50, approximately 0.38 MHz for the signal curve 51 at 50% short-circuit, and for the 100% short circuit, signal 52 in FIG. 8, an approximate value of 0.33 MHz (52B).

No complicated algorithms were used in the tests, but rather purely mathematical methods for determining the characteristic parameters used, namely overshoot and natural frequency. As is clearly discernible from FIGS. 9A and 9B, the characteristic parameters determined have a low variance, which enables a reliable and fast detection of even smallest changes in the turn capacitance.

As mentioned previously, in order to monitor continuously the state of the windings in online operation, it is advantageous to determine the characteristic parameters of the signal in an intact machine 2, a properly functioning machine, for example, in a commissioning phase. It is then consequently important to ensure that no changes in resistance, inductance or capacitance values, such as those caused by changes in the wiring layout, are introduced.

It is also possible to determine as part of the measurements the damping constant of the transient natural oscillation—in addition to or instead of the natural frequency 1/ΔT—as a characteristic parameter. One method of doing so, for example, is to approximate the decay behaviour of the transient oscillation from the size and timing of each overshoot and undershoot, using simple exponential functions.

The invention claimed is:

1. A method for the online detection of a deterioration in insulation in an electrical machine comprising:
   using an inverter to apply a stepped voltage to at least one winding of the machine to result in at least one current (i) and/or time derivative thereof (di/dt);
   detecting the at least one current (i) and/or time derivative thereof (di/dt) as a measurement signal using at least one sensor;
   oversampling the measurement signal at frequency which is relatively high compared to a characteristic frequency for a transient oscillation to obtain an oversampling signal; and
   analyzing the oversampling signal with regard to at least one characteristic parameter of a transient process in order to detect a possible deterioration of an insulation.

2. The method of claim 1, wherein the at least one characteristic parameter of a transient process is overshoot ($\Delta h$) and/or natural frequency ($1/\Delta T$) and/or damping constant.

3. The method of claim 2, further comprising determining natural frequency ($1/\Delta T$) by calculating a time interval between consecutive oversampled extreme values of the measurement signal.

4. The method of claim 2, further comprising determining overshoot ($\Delta h$) as a difference between a value in a steady-state condition and at least one extreme value in the measurement signal.

5. The method of claim 1, further comprising comparing the characteristic parameter with a corresponding characteristic parameter obtained in a previous measurement procedure on a properly functioning machine.

6. The method of claim 1, further comprising comparing the characteristic parameter with a predefined threshold value, which, if exceeded, results in an error condition being decided.

7. The method of claim 1, further comprising using a steady state condition ($y_\infty$) of the measurement signal as a characteristic parameter to detect actual insulation faults.

8. The method of claim 7, further comprising detecting at least one time derivative (di/dt) of the induced current and determining a value ($y_\infty$) of the signal in the steady-state condition as a last measured value when a constant voltage is applied.

9. The method of claim 7, further comprising directly detecting the induced current (i) in the steady-state condition and determining a value ($y_\infty$) of the signal via two separate samples and a slope defined by them in the signal.

10. The method of claim 1, further comprising making a plurality of measurements based on application of a stepped voltage and conducting a statistical evaluation of obtained results.

11. A device for the online detection of a deterioration in the state of an insulation in an electrical machine comprising a supply circuit having an inverter associated with an electrical machine and at least one sensor arranged in a current supply conductor to the machine, which sensor, on application of a stepped voltage during use, detects a current (i) induced in at least one winding of the machine or a time derivative (di/dt) thereof as a measurement signal, wherein the sensor is connected to an oversampling device for oversampling the measurement signal at a comparatively high frequency relative to transient processes and samples obtained are supplied to a computer unit for determining at least one characteristic parameter of a transient process on application of stepped voltage in order to detect a possible deterioration of an insulation during use.

12. The device of claim 11, wherein at least one characteristic parameter of a transient process is overshoot ($\Delta h$) and/or natural frequency ($1/\Delta T$) and/or damping constant.

13. The device of claim 11, further comprising at least one comparator unit for comparing characteristic parameters obtained with corresponding stored characteristic parameters of the machine when functioning properly and/or with a pre-specified threshold value during use.

14. The device of claim 13, wherein the comparator unit is connected to an evaluation unit for the detection and identification of deteriorations and, where appropriate, faults in insulations during use.

15. The device of claim 11, further comprising a window circuit between the oversampling device and the computing unit proper, wherein the window circuit has a control input connected to a control unit controlling the inverter and specifies a predefined observation window starting with a control signal from the control unit, in which the samples are supplied to a further processing stage.

16. The device of claim 11, wherein the computing unit is embodied with a field-programmable gate array (FPGA).

17. The device of claim 11, wherein the computing unit comprises a digital signal processor (DSP).

* * * * *